(12) United States Patent
Leon

(10) Patent No.: US 8,810,178 B2
(45) Date of Patent: Aug. 19, 2014

(54) VARIABLE SPEED DRIVE WITH OPTIMIZED ARCHITECTURE

(75) Inventor: Frederic Leon, Marcilly sur Eure (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 39 days.

(21) Appl. No.: 13/412,074

(22) Filed: Mar. 5, 2012

(65) Prior Publication Data

US 2012/0249031 A1 Oct. 4, 2012

(30) Foreign Application Priority Data

Apr. 4, 2011 (FR) ...................................... 11 52851

(51) Int. Cl.
*H02P 6/14* (2006.01)

(52) U.S. Cl.
USPC .......................... 318/400.26; 363/147; 363/44

(58) Field of Classification Search
USPC .......................... 318/400.26; 363/44, 141, 147
See application file for complete search history.

(56) References Cited

U.S. PATENT DOCUMENTS 5,905,647 A * 5/1999 Shirai ............................ 363/141
7,746,648 B2 * 6/2010 Yamada et al. ............... 361/715

2004/0223301 A1 * 11/2004 Muller et al. ................. 361/699
2009/0016018 A1   1/2009 Kunkle
2010/0202109 A1   8/2010 Zheng et al.

FOREIGN PATENT DOCUMENTS

WO   WO 2008/071192 A1   6/2008

OTHER PUBLICATIONS

French Preliminary Search Report and Written Opinion issued on Nov. 24, 2011 in corresponding French Application No. 11 52851 filed on Apr. 4, 2011 (with an English Translation of Categories).

* cited by examiner

*Primary Examiner* — Bentsu Ro
*Assistant Examiner* — Bickey Dhakal
(74) *Attorney, Agent, or Firm* — Oblon, Spivak, McClelland, Maier & Neustadt, L.L.P.

(57) ABSTRACT

The invention relates to a variable speed drive (1) connected upstream to an electric power grid (R) and downstream to an electric motor (M), the variable speed drive comprising notably a main casing comprising a base (14) and a main closure cover (15) closing on the base (14), a rectifier module (10), an inverter module (11), these modules being inserted inside the casing, and one or more bus capacitors (13). The main closure cover (15) comprises one or more openings (151) each traversed by a bus capacitor (13) and the variable speed drive comprises a secondary closure cover (17) fitting onto the main closure cover (15) and covering the said one or more bus capacitors (13).

4 Claims, 2 Drawing Sheets

VARIABLE SPEED DRIVE WITH OPTIMIZED ARCHITECTURE

TECHNICAL FIELD OF THE INVENTION

The present invention relates to a variable speed drive and notably to its architecture and to the arrangement of its internal modules.

DESCRIPTION OF THE PRIOR ART

As is known, a variable speed drive is connected upstream to an electric power grid and downstream to an electric motor. A variable speed drive comprises mainly:
- at the input, a rectifier module usually consisting of a diode bridge designed to rectify the AC voltage supplied by the electric power grid,
- a DC power supply bus to which the rectified voltage is applied by the rectifier module, the DC power supply bus being furnished with one or more bus capacitors making it possible to keep the voltage of the bus at a constant value,
- at the output, an inverter module designed to transform the voltage of the DC bus into a variable voltage to be applied to the electric motor.

These various elements are arranged inside a casing made in two portions. A first portion consists of a base to which the various modules and components of the variable speed drive are directly or indirectly attached and a second portion consists of a closure cover that closes on the base in order to close the casing.

At the rear, a variable speed drive may comprise a baseplate or a heat sink comprising a heat dissipater and a fan. When the bus capacitors are situated towards the front of the variable speed drive, they are not cooled directly by the heat sink or by means of the baseplate. Moreover, when the variable speed drive mounted on a baseplate is certified for example as IP54, IP55 or IP66, it proves yet more difficult to cool the bus capacitors because the capacitors are enclosed in a sealed manner inside the casing of the variable speed drive. These cooling difficulties are likely to reduce the service life of the variable speed drive.

SUMMARY OF THE INVENTION

The object of the invention is therefore to propose a variable speed drive allowing easier cooling of the bus capacitors, notably when the variable speed drive mounted on a baseplate is certified IP54.

This object is achieved by a variable speed drive connected upstream to an electric power grid and downstream to an electric motor, the variable speed drive comprising:
- a main casing comprising a base and a main closure cover closing on the base,
- a rectifier module inserted inside the casing and designed to rectify an AC voltage supplied by the electric power grid,
- an inverter module inserted inside the casing and designed to transform a DC voltage into a variable voltage to be applied to the electric motor,
- a DC power supply bus connecting the rectifier module to the inverter module, the DC power supply bus being furnished with one or more bus capacitors making it possible to keep the voltage of the bus at a constant value.

The variable speed drive is characterized in that:
- the main closure cover comprises one or more openings each traversed by a bus capacitor,
- it comprises a secondary closure cover fitting onto the main closure cover and covering the said one or more bus capacitors.

According to one particular feature, the said one or more bus capacitors are assembled on an electronic circuit board and the variable speed drive comprises a seal cut out to the shape of the said one or more bus capacitors and arranged between the said electronic circuit board and the main closure cover.

According to another particular feature, the main closure cover comprises a recess occupied by the said one or more bus capacitors.

According to another particular feature, the secondary closure cover comprises aeration slots.

BRIEF DESCRIPTION OF THE FIGURES

Other features and advantages will appear in the following detailed description referring to an embodiment given as an example and represented by the appended drawings in which.

DETAILED DESCRIPTION OF AT LEAST ONE EMBODIMENT

Figure 1:
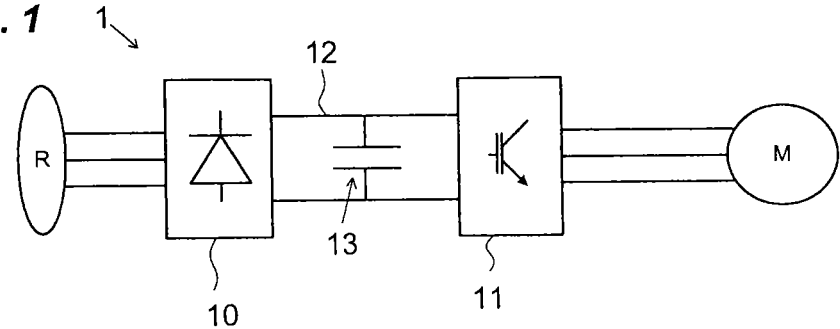
FIG. 1 represents a wiring diagram of a variable speed drive.
Figure 2:
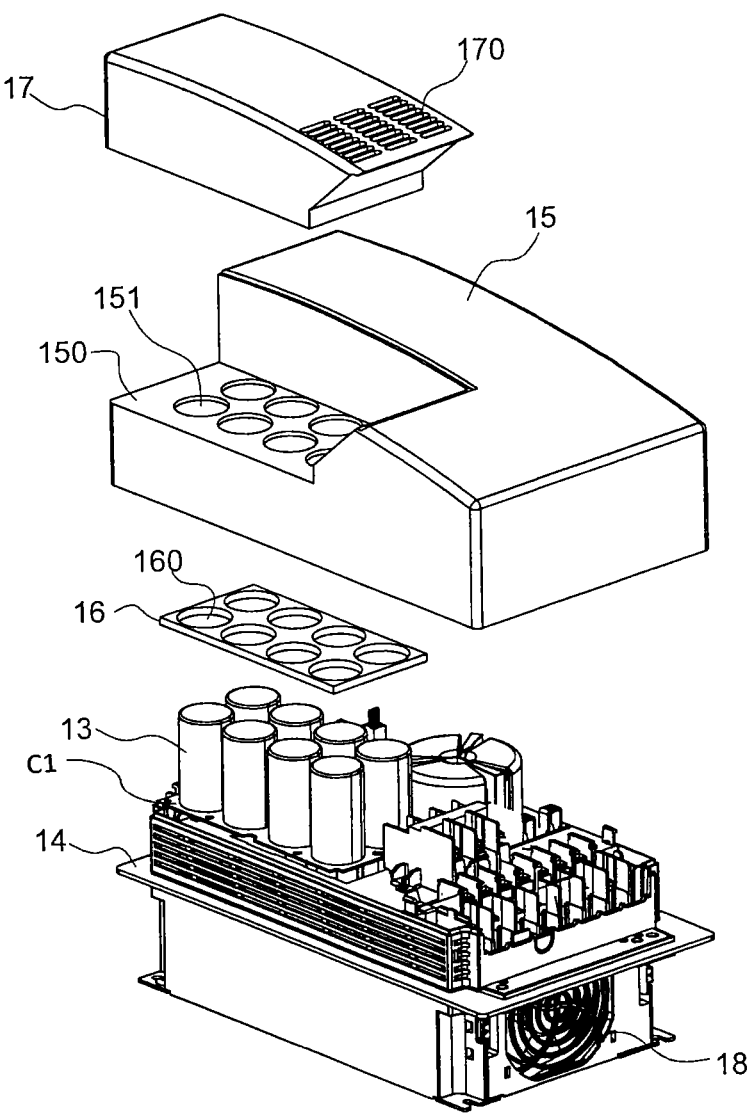
FIG. 2 represents, in an exploded view, the variable speed drive of the invention.
Figure 3:
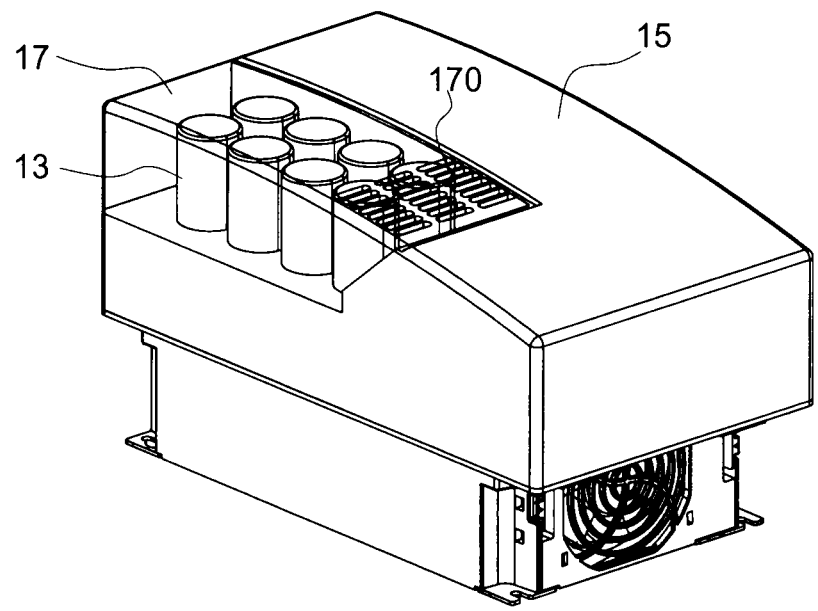
FIG. 3 represents, seen in perspective, the variable speed drive of the invention.
Figure 4:
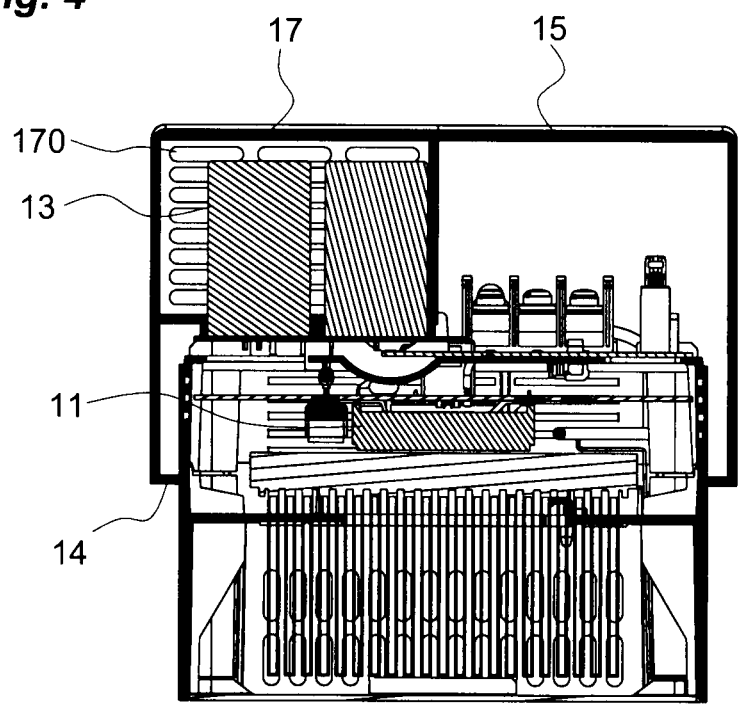
FIG. 4 represents, seen in cross section, the variable speed drive of the invention.

With reference to FIG. 1, a variable speed drive 1 comprises a rectifier module 10 connected to an electric power grid R and usually consisting of a diode bridge, an inverter module 11 comprising commutation switches such as for example IGBTs making it possible to supply various levels of voltage to an electric motor M, and a DC power supply bus 12 connecting the rectifier module 10 to the inverter module 11. The DC power supply bus 12 comprises a first power supply line with positive potential and a second power supply line with negative potential and one or more bus capacitors 13 connected on the one hand to the first power supply line and on the other hand to the second power supply line. In the rest of the description, an example will be taken of a variable speed drive that comprises several bus capacitors 13.

The various constituent elements of the rectifier module 10, of the inverter module 11 and of the bus capacitors 13 are assembled on one or more electronic circuit boards attached to a base 14 forming the base of a casing. The casing also comprises a main closure cover 15 fitting onto the base. One or more seals may be provided to seal the closing of the main closure cover 15 onto the base 14 for the purpose of certifying the variable speed drive as IP54. The bus capacitors 13 are notably arranged in front of the variable speed drive on an electronic circuit board C1 parallel to the base 14. The bus capacitors 13 comprise for example a cylindrical head upright on their electronic circuit board C1. A cooling system, such as a fan 18 or a baseplate, situated under the base 14, may be provided to cool the modules situated inside the casing or make heat exchanges easier. In the figures, the variable speed drive 1 is shown with a fan 18. It should be understood that the invention is common to both types of architecture and that it is of value when the variable speed drive is mounted on a baseplate and when it is intended to be certified IP54, IP55 or IP66.

The main closure cover 15 also comprises a recess 150 formed on the outside. In this recess 150, the main closure cover 15 comprises openings 151 each having a shape adapted to be traversed by a bus capacitor 13. If the bus capacitors 13 have a circular section, these openings will then be made in a circular manner. When the main closure cover 15 is in place on the base 14, the bus capacitors 13 traverse the openings 151 so as to emerge at the recess 150 made on the main closure cover 15.

To ensure that the variable speed drive 1 is sealed and is certified IP54, IP55 or IP66, a seal 16 is arranged between the bus capacitors 13 and the edges of the openings 151 provided on the main closure cover 15. This seal 16 takes the form, for example, of a rubber sheet comprising openings 160 that are equivalent to the openings 151 made through the main closure cover 15 and are situated opposite to these openings 151 in order to be traversed by the bus capacitors when the main closure cover 15 is closed onto the base 14. The seal 16 is thus pressed against the electronic circuit board C1 supporting the bus capacitors 13 and the internal face of the main closure cover 15 presses against the said seal 16 when the cover is in place on the base 14.

According to the invention, the variable speed drive 1 also comprises a secondary, removable closure cover 17 designed to be fitted onto the main closure cover 15 at its recess 150 in order to enclose the bus capacitors 13. The secondary closure cover has a shape suitable for matching and extending the main closure cover 15 around the bus capacitors 13.

Means for coupling the secondary closure cover 17 to the main closure cover 15 are provided to achieve the closure. This secondary closure cover comprises for example aeration slots 170 making it possible to allow air to pass through in order to cool the bus capacitors. This secondary closure cover 17 therefore makes it possible to protect the bus capacitors 13 while allowing them to be aerated.

The architecture of the invention therefore makes it possible to propose a variable speed drive certified IP54 while not neglecting the cooling of the bus capacitors 13.

It is clearly understood that, without departing from the context of the invention, it is possible to imagine other variants and enhancements of detail and even to envisage the use of equivalent means.

The invention claimed is:

1. A variable speed drive connected upstream to an electric power grid and downstream to an electric motor, the variable speed drive comprising:
   a main casing comprising a base and a main closure cover closing on the base;
   a rectifier module inside the casing and designed to rectify an AC voltage supplied by the electric power grid;
   an inverter module inside the casing and designed to transform a DC voltage into a variable voltage to be applied to the electric motor;
   a DC power supply bus connecting the rectifier module to the inverter module, the DC power supply bus including one or more bus capacitors assembled on an electronic circuit board making it possible to keep the voltage of the bus at a constant value, wherein
   the main closure cover comprises one or more openings each traversed by a bus capacitor, and a secondary closure cover fitting onto the main closure cover and covering the said one or more bus capacitors,
   the variable speed drive comprises a seal cut out to the shape of the one or more bus capacitors and arranged between and in contact with both of the electronic circuit board and the main closure cover,
   a base portion of the one or more bus capacitors that is connected to the electronic circuit board is contained within an interior of the main casing,
   an end portion of the one or more bus capacitors extends through the one or more openings, through the seal, outside of the interior, and into a volume that is outside of the main casing, and
   the secondary closure cover is removable and defines the volume, when fitted to the main closure cover, that is outside of the main casing and that includes the end portion of the one or more bus capacitors.

2. The variable speed drive according to claim 1, wherein the main closure cover comprises a recess occupied by the one or more bus capacitors.

3. The variable speed drive according to claim 1, wherein the secondary closure cover comprises aeration slots.

4. The variable speed drive according to claim 1, wherein the seal forms an environmental seal between the interior of the main casing and the volume defined by the secondary closure.

* * * * *